(12) United States Patent
Raman et al.

(10) Patent No.: US 10,392,531 B2
(45) Date of Patent: Aug. 27, 2019

(54) PROCESS FOR REMOVING A BULK MATERIAL LAYER FROM A SUBSTRATE AND A CHEMICAL MECHANICAL POLISHING AGENT SUITABLE FOR THIS PROCESS

(75) Inventors: Vijay Immanuel Raman, Mannheim (DE); Sophia Ebert, Mannheim (DE); Mario Brands, Ludwigshafen (DE); Yongqing Lan, Potsdam, NY (US); Philipp Zacharias, Mannheim (DE); Ilshat Gubaydullin, Ludwigshafen (DE); Yuzhuo Li, Heidelberg (DE)

(73) Assignee: BASF SE, Ludwigshafen (DE)

( * ) Notice: Subject to any disclaimer, the term of this patent is extended or adjusted under 35 U.S.C. 154(b) by 825 days.

(21) Appl. No.: 13/510,830

(22) PCT Filed: Nov. 25, 2010

(86) PCT No.: PCT/IB2010/055426
§ 371 (c)(1),
(2), (4) Date: May 18, 2012

(87) PCT Pub. No.: WO2011/064734
PCT Pub. Date: Jun. 3, 2011

(65) Prior Publication Data
US 2012/0235081 A1 Sep. 20, 2012

Related U.S. Application Data

(60) Provisional application No. 61/264,850, filed on Nov. 30, 2009.

(51) Int. Cl.
*C03C 15/00* (2006.01)
*C09G 1/02* (2006.01)
*C09K 3/14* (2006.01)
*H01L 21/321* (2006.01)

(52) U.S. Cl.
CPC .............. *C09G 1/02* (2013.01); *C09K 3/1463* (2013.01); *H01L 21/3212* (2013.01)

(58) Field of Classification Search
CPC ...... H01L 21/3212; C09G 1/02; C09K 3/1463
USPC .............................................. 252/79.1–79.5
See application file for complete search history.

(56) References Cited

U.S. PATENT DOCUMENTS

| | | | |
|---|---|---|---|
| 578,882 A | 3/1897 | Kennedy | |
| 5,057,560 A | 10/1991 | Mueller | |
| 6,068,787 A | 5/2000 | Grumbine et al. | |
| 6,083,838 A * | 7/2000 | Burton et al. | 438/691 |
| 6,682,642 B2 | 1/2004 | Mikkola et al. | |
| 6,740,590 B1 * | 5/2004 | Yano et al. | 438/692 |
| 7,161,603 B2 | 1/2007 | Saito et al. | |
| 7,250,391 B2 | 7/2007 | Kanno et al. | |
| 7,300,601 B2 | 11/2007 | Liu et al. | |
| 7,361,603 B2 | 4/2008 | Liu et al. | |
| 7,419,519 B2 * | 9/2008 | Li et al. | 51/307 |
| 7,696,095 B2 * | 4/2010 | Oswald et al. | 438/693 |
| 7,833,431 B2 | 11/2010 | Minamihaba et al. | |
| 8,314,028 B2 * | 11/2012 | Hong et al. | 438/692 |
| 2002/0198328 A1 | 12/2002 | L'Alloret | |
| 2003/0051413 A1 | 3/2003 | Sakai et al. | |
| 2003/0228762 A1 * | 12/2003 | Moeggenborg et al. | 438/691 |
| 2004/0092102 A1 * | 5/2004 | Li et al. | 438/689 |
| 2004/0209095 A1 | 10/2004 | Manias et al. | |
| 2004/0217009 A1 | 11/2004 | Mikkola et al. | |
| 2005/0014667 A1 | 1/2005 | Aoyama et al. | |
| 2005/0095221 A1 * | 5/2005 | Balasubramanian | C08G 65/30 424/78.36 |
| 2005/0176259 A1 | 8/2005 | Yokoi et al. | |
| 2005/0263490 A1 | 12/2005 | Liu et al. | |
| 2005/0266683 A1 | 12/2005 | Lee | |
| 2006/0030503 A1 * | 2/2006 | Minamihaba et al. | 510/175 |
| 2006/0141254 A1 | 6/2006 | Kramer et al. | |
| 2006/0148667 A1 | 7/2006 | Fukasawa et al. | |

(Continued)

FOREIGN PATENT DOCUMENTS

| | | |
|---|---|---|
| DE | 26 10 705 | 9/1977 |
| EP | 0 583 814 | 2/1994 |

(Continued)

OTHER PUBLICATIONS

Wohlfarth ("CRC Handbook of Liquid-Liquid Equilibrium Data of Polymer Solution", CRC Press, Nov. 19, 2007, p. 56), excerpt retrieved Jun. 16, 2015 from Google Books.*
U.S. Appl. No. 13/510,514, filed May 17, 2012, Raman, et al.
U.S. Appl. No. 13/503,753, filed Apr. 24, 2012, Lauter, et al.
U.S. Appl. No. 13/821,769, filed Mar. 8, 2013, Li, et al.
"Pluronic and Tetronic Block Copolymer Surfactants, 1996," BASF Corporation, Total 42 Pages, (1996).

(Continued)

*Primary Examiner* — Nadine G Norton
*Assistant Examiner* — Christopher Remavege
(74) *Attorney, Agent, or Firm* — Oblon, McClelland, Maier & Neustadt, L.L.P.

(57) ABSTRACT

A process for removing a bulk material layer from a substrate and planarizing the exposed surface by CMP by (1) providing an CMP agent exhibiting at the end of the chemical mechanical polishing, without the addition of supplementary materials, the same SER as at its start and a lower MRR than at its start, —an SER which is lower than the initial SER and an MRR which is the same or essentially the same as the initial MRR or a lower SER and a lower MRR than at its start; (2) contacting the surface of the bulk material layer with the CMP agent; (3) the CMP of the bulk material layer with the CMP agent; and (4) continuing the CMP until all material residuals are removed from the exposed surface; and a CMP agent and their use for manufacturing electrical and optical devices.

16 Claims, No Drawings

(56) References Cited

U.S. PATENT DOCUMENTS

| | | |
|---|---|---|
| 2006/0175298 A1 | 8/2006 | Zhao et al. |
| 2006/0213780 A1 | 9/2006 | Shih et al. |
| 2007/0029198 A1 | 2/2007 | Kooi |
| 2007/0289875 A1 | 12/2007 | Paneccasio, Jr. et al. |
| 2008/0035882 A1 | 2/2008 | Zhao et al. |
| 2008/0050435 A1 | 2/2008 | Hennink et al. |
| 2008/0248727 A1 | 10/2008 | Shindo et al. |
| 2008/0249210 A1 | 10/2008 | Entenmann et al. |
| 2008/0254628 A1 | 10/2008 | Boggs et al. |
| 2008/0280452 A1 | 11/2008 | Yokoi et al. |
| 2009/0013609 A1 | 1/2009 | Gupta et al. |
| 2009/0087988 A1* | 4/2009 | Saie .............................. 438/693 |
| 2009/0137122 A1 | 5/2009 | Liu et al. |
| 2011/0189487 A1 | 8/2011 | Zacharias et al. |
| 2011/0269312 A1 | 11/2011 | Li et al. |
| 2012/0045970 A1 | 2/2012 | Li et al. |
| 2012/0058641 A1 | 3/2012 | Raman et al. |
| 2012/0058643 A1 | 3/2012 | Raman et al. |
| 2012/0077419 A1 | 3/2012 | Zhang et al. |

FOREIGN PATENT DOCUMENTS

| | | |
|---|---|---|
| EP | 1 036 836 | 9/2000 |
| EP | 1 197 587 | 4/2002 |
| EP | 1 306 415 | 5/2003 |
| EP | 1 942 179 | 7/2008 |
| WO | 01 60926 | 8/2001 |
| WO | 2004 029160 | 4/2004 |
| WO | 2004 052946 | 6/2004 |
| WO | 2004 063301 | 7/2004 |
| WO | 2005 014753 | 2/2005 |
| WO | 2006 086265 | 8/2006 |
| WO | 2006 093242 | 9/2006 |
| WO | 2006 108857 | 10/2006 |
| WO | 2007 012763 | 2/2007 |
| WO | 2007 019342 | 2/2007 |
| WO | 2006 116770 | 11/2008 |
| WO | 2008 148766 | 12/2008 |

OTHER PUBLICATIONS

Schmaljohann, D., "Thermo- and pH-responsive polymers in drug delivery," Advanced Drug Delivery Reviews, vol. 58, pp. 1655-1670, (Oct. 18, 2006).

Mori, H., et al., "Controlled synthesis of thermoresponsive polymers derived from L-proline via RAFT polymerization," Chemical Communication, pp. 4872-4874, (Aug. 31, 2005).

International Search Report dated Apr. 21, 2011 in PCT/IB10/55426 Filed Nov. 25, 2010.

U.S. Appl. No. 13/580,039, filed Aug. 20, 2012, Raman, et al.

Extended European Search Report dated Aug. 23, 2013 in Patent Application No. 10832736.2.

U.S. Appl. No. 14/356,530, filed May 6, 2014, Seyffer, et al.

\* cited by examiner

PROCESS FOR REMOVING A BULK MATERIAL LAYER FROM A SUBSTRATE AND A CHEMICAL MECHANICAL POLISHING AGENT SUITABLE FOR THIS PROCESS

FIELD OF THE INVENTION

The invention is directed to a novel process for removing a bulk material layer from a substrate and a chemical mechanical polishing agent suitable for this process.

CITED DOCUMENTS

The documents cited in the present application are incorporated by reference in their entirety.

BACKGROUND OF THE INVENTION

Integrated circuits (ICs) consist of structured electrically semiconducting, non-conducting and conducting thin layers. These patterned layers are customarily prepared by applying a layer material, for example, by vapor deposition and patterning it by a microlithographic process. By way of the combination of the various electrically semiconducting, non-conducting and conducting layered materials the electronic circuit elements such as transistors, capacitors, resistors and wirings are fabricated.

The quality of an IC and of its function depends particularly on the precision with which the various layer materials can be applied and patterned.

However, with an increasing number of layers the planarity of the layers decreases significantly. This leads to the failure of one or more functional elements of the IC and, therefore, to the failure of the complete IC after a certain number of layers has been reached.

The decrease of the planarity of the layers is caused by the buildup of new layers on top of layers already patterned. By the patterning altitude differences are created which can add up to 0.6 µm per layer. These altitude differences add up from layer to layer and bring about that the next following layer can no longer be applied onto a planar surface but only onto an uneven surface. The first result is that the layer subsequently applied has an irregular thickness. In extreme cases, imperfections, defects in the electronic functional elements and lacking electrical contacts are caused. Moreover, uneven surfaces lead to problems with the patterning. In order to be able to create sufficiently small patterns, an extremely acute depth of focus is a necessary in the microlithographic process step. However, these patterns can only be imaged with acuity on a planar surface. The more the locations deviate from the planarity, the murkier the image becomes.

In order to solve this problem, a so-called chemical mechanical polishing (CMP) is carried out. The CMP causes a global planarization of the patterned surface by the removal of protruding features of the layer until a planar layer is obtained. Because of this, the subsequent buildup can take place on top of a planar surface exhibiting no altitude differences, and the precision of the patterning and of the functionality of the elements of the IC is maintained.

Typical examples for the global planarization are dielectric CMP, nickel phosphide CMP and silicium or polysilicium CMP.

In addition to the global planarization to overcome lithographical difficulties, there are two other important applications for CMP. One is to fabricate microstructures. Typical examples for this application are copper CMP, barrier CMP, tungsten CMP or shallow trench isolation (STI) CMP, in particular the Damascene process described below. The other is defect correction or elimination, as for example sapphire CMP.

A CMP process step is carried out with the help of special polishers, polishing pads and polishing agents which are also referred to in the art as polishing slurries or CMP slurries. A CMP slurry is a composition, which in combination with the polishing pad causes the removal of the material to be polished.

In case that wafers with semiconductor layers are to be polished, the precision requirements for the process step and, thus, the requirements set for the CMP slurry are particularly strict.

A series of parameters are used for evaluating the efficiency of CMP slurries and for characterizing their activity. The material removal rate (MRR), that is the speed with which the material to be polished is removed, the selectivity, that is the ratio of the removal rate of the material to be polished to the removal rates of other materials present, the removal uniformity within a wafer (WIWNU; Within-Wafer-Non-Uniformity) and the removal uniformity from wafer to wafer (WTWNU; Wafer-to-Wafer-Non-Uniformity) as well as the number of defects per unit of area rank among these parameters.

The copper Damascene process is increasingly used for the fabrication of IC (cf., for example, the European patent application EP 1 306 415 A2, page 2, paragraph [0012]). In order to produce the copper circuit paths, it is necessary to remove a copper layer chemically mechanically in this process with the help of a CMP slurry, this process is also called "copper CMP process" in the art. The completed copper circuit paths are embedded in a dielectric. Customarily, a barrier layer customarily consisting of tantalum or tantalum nitride is located between the copper and the dielectric in order to prevent the copper from diffusing into the dielectric layer.

In general, the copper damascene process requires CMP agents providing a good planarization, i.e. a high MRR, combined with a low static etch rate SER. Typically, the desired MRR/SER ratio is approximately 40 or higher. Moreover, the selectivity of the copper CMP agents have to be very high, i.e., the copper MRR must be much higher than the barrier layer MRR. Typically, the selectivity must be greater than 100:1, e.g., about 100:1 to about 400:1.

Even if this property profile is achieved, additional problems arise during copper CMP. These problems are caused by the fact that the conditions and requirements at the end of the CMP process differ from those at the beginning.

Thus, the bulk of the copper is rapidly removed during CMP. During this process, the temperature of the CMP agent increases and, at the end of the process, is about 10 to 20° C. higher than at the beginning. In addition, when hydrogen peroxide is used as the oxidizing agent, its decomposition is accelerated by the increasing copper concentration. On the other hand, the protrusions on the polished surface have almost disappeared. All in all, this renders the CMP slurry much more aggressive than at the beginning.

Quite contrary to this, a much lower MRR is needed at the final stage of the CMP process in order to prevent dishing and/or erosion, in particular during the so-called "over-polishing", and thus, loss of wafer surface planarity and uniformity. Generally, over-polishing is required to remove residuals of copper from the polished surface. Dishing occurs when the copper and the barrier MRR are disparate and as such, too much copper is removed such that the copper surface in the features is recessed relative to the barrier and/or dielectric surface of the microelectronic device wafer. Oxide erosion occurs when too much dielectric material is removed.

In order to ameliorate or completely avoid these problems, techniques of so-called "soft landing" or "touchdown" have been developed.

Thus, the temperature soft landing technique involves the cooling of the CMP agents and/or the pad. However, this requires additional equipment which increases the overall costs of the manufacturing process.

The chemical soft landing technique involves the use of two CMP agents: an aggressive CMP agent at the beginning of the CMP process and a less aggressive CMP agent at the end of the CMP process. The second, less aggressive CMP agent can be obtained by diluting the first CMP agent (cf. the American U.S. Pat. No. 7,161,603 B2) or by adding supplementary additives (cf. the American patent application US2008/0254628 A1). However, this technique requires a particularly careful monitoring of the CMP process in order to detect the appropriate time for applying the second CMP agent.

The mechanical soft landing technique involves the lowering of the downforce and/or the rotational speed of the polishing pad. By way of this technique it was possible to reduce problems like dishing and micro-scratching and to enhance the copper/barrier selectivity. However, due to the increasing demand in lowering the initial downforce, there will be no downforce gap left to achieve the mechanical soft landing. Furthermore, with the high chemical activity of the copper CMP agents, the Prestonian response is getting smaller and smaller. Moreover, it is very costly to upgrade the polishers to handle downforces<3.448 kPa (<0.5 psi).

Consequently, it would be highly desirable to have a CMP agent and a CMP process at hand which could avoid all the disadvantages associated with the prior art soft landing techniques.

The American patent application US 2009/0013609 A1 discloses a CMP agent containing colloidal, cross-linked, thermally responsive, hybrid particles prepared from N-isopropyl acrylamide (NIPAM) and 3-(trimethoxysilyl)propyl methacrylate. The hybrid particles which contain poly(N-isopropyl acrylamide) (PNIPAM) which is a well-known thermally responsive polymer having a lower critical solution temperature LCST, i.e. a critical temperature below which PNIPAM is soluble in water, of 32° C. Therefore, when the temperature of the hybrid particles reaches the LCST, a volume phase transition takes place which causes a sudden change in the solvation state. This means that the volume of the hybrid particles suddenly decreases due to a coil-to-globule transition of the PNIPAM polymer chains. However, this phase transition is also accompanied by a soft-to-hard transition. Therefore, the skilled artisan would expect that such hybrid particles would become harder and increase copper removal at the end of the CMP process and, in addition, would cause increased scratching, dishing and erosion. A soft landing behavior is not disclosed.

The American patent application US 2006/0148667 A1 discloses a CMP agent comprising a water-soluble polymer having a polymer chain derived from N-monosubstituted and N,N-disubstituted acrylamides, methacrylamides and alpha-substituted products thereof, such as N-isopropylacrylamide (NIPAM), N-methylolacrylamide, N-acetylacrylamide or N-diacetoneacrylamide, and other optional monomers such as acrylic acid, acrylic acid esters, methacrylic acid, methacrylic acid esters, acrylamide, vinyl alcohol, acrylonitrile, vinylpyrrolidone, vinylpyridine, vinyl acetate, maleic acid, fumaric acid, itaconic acid, and p-styrene carboxylic acid. The added amount of the water-soluble polymer must not be chosen too high or else the CMP agent may gelatinize so that the fluidity thereof may be lowered. The CMP agent is primarily used for polishing silicon dioxide films, however, also other materials may be polished with it. A soft landing behavior is not disclosed.

The prior application of BASF SE, docket No. PF 62096 EP, filed on Mar. 6, 2009 describes a copper CMP agent containing, as the abrasive, polymer particles having a mean particle size $d_{50}$ of 76 nm as measured by HPPS dynamic light scattering and being preparable by:

Charging under nitrogen 1500 g of deionized water and 4.5 g of hexadecyltrimethylammonium bromide to a reaction flask, heating the contents of the flask up to 70° C., charging, at this temperature, 0.68 g 2,2'-azo-(2-amidinopropane) dihydrochloride to the reaction flask, simultaneously starting a monomer feed consisting of 630 g of deionized water, 391.5 g styrene, 60 g of methacrylamide as a 15% solution in water, 4.5 g of divinylbenzene, and 2.48 g of hexadecyltrimethylammonium bromide and continually feeding it for 1.5 hours, starting, at the same time, an initiator feed containing 170 g of deionized water and 2.3 g of 2,2'-azo-(2-amidinopropane)dihydrochloride and continually feeding it to the reaction flask for 2.5 hours, starting after 1.5 hours from the start of the first monomer feed, a second monomer feed consisting of 255 g of deionized water, 13.5 g of 2-dimethylaminoethyl methacrylate, 0.9 g of hexadecyltrimethylammonium bromide and 31.5 g of styrene and continually feeding it to the reaction flask during 30 minutes;

post-polymerizing the obtained reaction mixture for 2 hours at 70° C. and then cooling it down to room temperature, thereby obtaining a dispersion of solid polymeric particles with a solids content of 15% by weight.

The CMP slurry exhibits an MRR of 478.2 nm/minute and an SER of 19.7 nm/minute at 50° C. A soft landing behavior is not described.

OBJECTS OF THE INVENTION

It was the object of the present invention to suggest a novel process for removing a bulk material layer from the surface of a substrate and planarizing the exposed surface by chemical mechanical polishing (CMP), which process no longer exhibits the disadvantages of the prior art processes.

In particular, the said novel process should allow for a soft landing of the CMP process in the over-polishing stage with significantly reduced scratching, dishing and erosion of the exposed surface of the substrate including metal patterns embedded in said surface. These advantages should be particularly achieved in the shallow trench isolation (STI) process and in the copper damascene process. Moreover, these advantages should be achieved without the use of costly additional and/or modified equipment and/or the use of at least two CMP agents in one CMP process.

Additionally, it was the object of the present invention to provide a novel aqueous chemical mechanical polishing agent (CMP agent) which can be used in a process for removing bulk material layer from the surface of a substrate and planarizing the exposed surface by CMP, which novel CMP agent should no longer exhibit the disadvantages of the prior art CMP agents.

In particular, the novel CMP agent should allow for a soft landing of the CMP process in the over-polishing stage with significantly reduced scratching, dishing and erosion of the exposed surface of the substrate including metal patterns embedded in said surface. These advantages should be particularly achieved in the show trench isolation (STI) process and in the copper damascene process. Moreover, these advantages should be achieved without the use of costly additional and/or modified equipment and/or the use of at least two CMP agents in one CMP process.

Furthermore, it was the object of the present invention to provide a novel use of the novel CMP process and the novel CMP agent for the manufacture of electrical and optical devices.

SUMMARY OF THE INVENTION

Accordingly, a novel process for removing a bulk material layer from the surface of a substrate and planarizing the exposed surface by chemical mechanical polishing has been found, the said process comprising the steps of
(1) providing an aqueous chemical mechanical polishing agent (A) exhibiting at the end of the chemical mechanical polishing, without the addition of supplementary materials,
  the same or essentially the same static etch rate SER as at its start and a lower material removal rate MRR than at its start,
  lower SER at the end than at the start and the same or essentially the same MRR or
  a lower static etch rate SER and a lower material removal rate MRR than at its start;
(2) contacting the surface of the bulk material layer with the said aqueous chemical mechanical polishing agent (A);
(3) chemically and mechanically polishing the bulk material layer with the said aqueous chemical mechanical polishing agent (A) whilst
  its initial SER remains the same or essentially the same and its initial MRR decreases,
  its initial SER decreases and its initial MRR remains the same or essentially the same or
  its initial SER and its initial MRR both decrease,
  until the bulk metal layer is removed and the substrate surface is exposed; and
(4) continuing the chemical mechanical polishing with the chemical mechanical polishing agent (A) having, at this stage of the process,
  a SER which is the same or essentially the same as the initial SER and a MRR which is lower than the initial MRR,
  a SER which is lower than the initial SER and a MRR which is the same or essentially the same as the initial MRR
  a SER and a MRR which are both lower than the initial SER and the initial MRR,
  until all material residuals are removed from the exposed surface.

Hereinafter, the novel process for removing a bulk material layer from the surface of a substrate and planarizing the exposed surface by chemical mechanical polishing is referred to as the "process of the invention".

Moreover, a novel aqueous chemical mechanical polishing agent (A) has been found comprising
(a1) at least one component (a1) selected from the group consisting of cross-linked and non-cross-linked, linear, branched, hyperbranched, star shaped and dendrimeric copolymers (a11) of at least one monomer (a111) selected from the group of acrylic acid, methacrylic acid, maleic anhydride acrylamide, methacrylamide and vinyl aromatics, and at least one monomer (a112) selected from the group consisting of N,N-dialkylaminoalkyl acrylate and methacrylate; and cross-linked and non-cross-linked, linear, branched, hyperbranched, star shaped and dendrimeric polyethers (a12) containing or consisting of at least one chain of copolymerized ethylene oxide moieties (a121) and at least one kind of alkylene oxide moieties (a122) having at least 3 carbon atoms to the moiety, the said chain having a distribution selected from the group of statistical, alternating and block form distributions; and
(a2) at least one additional component;
with the exception of
a polymer having a mean particle size $d_{50}$ of 76 nm as measured by HPPS dynamic light scattering prepared by:
  Charging under nitrogen 1500 g of deionized water and 4.5 g of hexadecyltrimethylammonium bromide to a reaction flask,
  heating the contents of the flask up to 70° C.,
  charging, at this temperature, 0.68 g 2,2'-azo-(2-amidinopropane) dihydrochloride to the reaction flask,
  simultaneously starting a monomer feed consisting of 630 g of deionized water, 391.5 g styrene, 60 g of methacrylamide as a 15% solution in water, 4.5 g of divinylbenzene, and 2.48 g of hexadecyltrimethylammonium bromide and continually feeding it for 1.5 hours,
  starting, at the same time, an initiator feed containing 170 g of deionized water and 2.3 g of 2,2'-azo-(2-amidinopropane)dihydrochloride and continually feeding it to the reaction flask for 2.5 hours,
  starting after 1.5 hours from the start of the first monomer feed, a second monomer feed consisting of 255 g of deionized water, 13.5 g of 2-dimethylaminoethyl methacrylate, 0.9 g of hexadecyltrimethylammonium bromide and 31.5 g of styrene and continually feeding it to the reaction flask during 30 minutes;
  post-polymerizing the obtained reaction mixture for 2 hours at 70° C. and then cooling it down to room temperature,
  thereby obtaining a dispersion of solid polymeric particles with a solids content of 15% by weight.

Hereinafter, the novel aqueous chemical mechanical polishing agent is referred to as the "CMP agent of the invention".

Last but not least, a novel use of the process and the CMP agents of the invention for the manufacture of electrical and optical devices has been found.

Advantages of the Invention

In view of the prior art discussed above, it was surprising and could not be expected by the skilled artisan that the objects underlying the present invention could be solved by the process, the CMP agent and the use of the invention.

Thus, the process of the invention no longer exhibited the disadvantages of the prior art CMP processes. In particular, the process of the invention allowed for a soft landing in the over-polishing stage with significantly reduced scratching, dishing and erosion of the exposed surface of the substrate including the metal patterns embedded in said surface. These advantages were particularly achieved in the shallow trench isolation (STI) process and in the copper damascene process. Moreover, these advantages were achieved without the use of costly additional and/or modified equipment and/or the use of at least two CMP agents in one CMP process.

Moreover, the CMP agent of the invention no longer exhibited the disadvantages of the prior art CMP agents. In particular, the CMP agent of the invention was excellently suited for the use in a process for removing a bulk material layer from the surface of a substrate and planarizing the exposed surface by CMP.

Especially, the novel CMP agent allowed for a soft landing of the CMP process in the over-polishing stage with significantly reduced scratching, dishing and erosion of the exposed surface of the substrate including metal patterns embedded in said surface. These advantages were particularly achieved in the shallow trench isolation (STI) process and in the copper damascene process. Moreover, these advantages were achieved without the use of costly additional and/or modified equipment and/or the use of at least two CMP agents in one CMP process.

Furthermore, all in accordance with the use of the invention, the CMP process and the CMP agent of the invention were particularly well-suited for the manufacture of electrical devices, in particular, semiconductor integrated circuits (ICs); liquid crystal panels; organic electroluminescent panels; printed circuit boards; micro machines; DNA chips and micro plants; preferably ICs with LSI (large-scale integration) or VLSI (very-large-scale integration); and optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; and magnetic heads.

DETAILED DESCRIPTION OF THE INVENTION

In its broadest aspect, the present invention is directed to a process for removing a bulk material layer from the surface of a substrate and planarizing the exposed surface by chemical mechanical polishing (hereinafter referred to as "CMP") all in accordance with the process of the invention.

In the context of the present invention, the term "bulk material layer" designates a metal layer covering the surface of the substrate essentially completely or completely, including almost all or all of the features of the substrate such as recesses, indentations and protrusions.

The thickness of the bulk material layer can vary broadly and primarily depends on the dimensions of the features of the substrate and the electrical and optical devices which are to be prepared with the help of the process of the invention. Preferably, the thickness is of from 10 nm to 1 µm.

In the context of the present invention, the term "bulk material" includes all materials customarily used in the manufacture of ICs. Preferably, the bulk material is selected from the group consisting of dielectric materials, more preferably the dielectric materials hereinafter described, and electrically conductive materials, more preferably semiconductors and metals, most preferably metals. Most preferably, metals are used as the bulk materials.

In the context of the present invention, the term "metal" also includes metal alloys. Preferably, the metal has a standard reduction potential $E^0 > -0.1$ V, preferably $>0$ V, most preferably $>0.1$ V and in particular $>0.2$ V for the half-reaction $M \leftrightarrow M^{n+} + n\ e^-$, wherein n=integer of from 1 to 4 and $e^-$=electron.

Examples for such standard reduction potentials $E^0 > -0.1$ are listed in the CRC Handbook of Chemistry and Physics, 79th edition, 1998-1999, CRC Press LLC, Electrochemical Series, 8-21 to 8-31.

Preferably, the metal is selected from the group consisting of Ag, Au, Bi, Cu, Ge, Ir, Os, Pd, Pt, Re, Rh, Ru, Tl and W, most preferably Ag, Au, Cu, Ir, Os, Pd, Pt, Re, Rh, Ru and W. In particular, the metal is copper.

The substrate can be any substrate customarily used for the manufacture of electrical devices, in particular, semiconductor integrated circuits (ICs); liquid crystal panels; organic electroluminescent panels; printed circuit boards; micro machines; DNA chips and micro plants; preferably ICs with LSI (large-scale integration) or VLSI (very-large-scale integration); and for the manufacture of optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; and magnetic heads.

Preferably, semiconductor wafers, in particular, silicon wafers are used as the substrate.

The semiconductor wafer substrate can be planar without structures or it can have features like protrusions or indentations or recesses. Preferably, the semiconductor wafer substrate is planar without such features.

Preferably, the surface of the substrate exposed during the process of invention contains embedded metal patterns. Particularly preferably, the metal patterns contain or consists of the above-mentioned metals.

More preferably, these metal patterns are embedded in a non-conducting or insulating layer which contains or consists of low-k or ultra low-k dielectric materials, which non-conducting layer has a pattern which is complementary to the metal patterns.

This non-conducting or insulating layer having metal patterns embedded therein can be directly located on top of the semiconductor wafer substrate, i.e., it is the first layer of the IC. The said layer can also be located on top of at least one layer produced on top of the semiconductor wafer. Such a lower layer may contain customary and known etch stop layers at its upper surface. Preferably, such a lower layer is produced using the process of the invention, and, most preferably, using the CMP agent of the invention in the said process.

Suitable low-k or ultra-low-k materials and suitable methods of preparing the insulating dielectric layers are described in, for example, the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph or US 2008/0280452 A1, paragraphs [0024] to [0026] or in the American U.S. Pat. No. 7,250,391 B2, column 1, lines 49 to 54 or in the European patent application EP 1 306 415 A2, page 4, paragraph [0031].

When copper is used as the metal, a barrier layer is customarily located between the copper and the low-k or ultra low-k dielectric material in order to prevent the diffusion of copper into the said material. Examples of suitable barrier layers are known from the European patent application EP 1 306 415 A2, page 4, paragraph [0032].

The dimensions of the metal patterns and the complementary dielectric patterns can vary broadly and depend on the electrical and optical devices to be prepared with the help of the process of the invention. Thus, for example, the dimensions of such patterns used for the manufacture of integrated circuits (ICs) with LSI (large-scale integration) or VLSI (very-large-scale integration) are <100 nm, preferably <50 nm.

In the first process step of the process of the invention, an aqueous chemical mechanical polishing agent (A) (hereinafter referred to as "CMP agent (A)") is provided.

In the process of the invention, the CMP agent (A) exhibits, without the addition of supplementary materials, the behavior hereinafter described in detail.

The SER and MRR can vary broadly and, therefore, can be adapted in the most advantageous manner to the particularities and requirements of the equipment employed, the materials to be removed and the surfaces to be polished. Preferably, both at the beginning and the end of the CMP process of the invention, the MRR is higher than the SER in order to achieve a high planarization efficiency and to lower the danger of dishing and erosion. More preferably, the ratio of MRR to SER is chosen such that MRR/SER is greater than 10, even more preferably greater than 20, most preferably greater than 30 and particularly preferably greater than 40 both at the beginning and at the end of the CMP process of invention.

In the context of the present invention, the wording "without the addition of supplementary materials" means that no additional (i.e. supplementary) components, as for example, the components (a2) hereinafter described are added during the process of the invention, in order to change the physical and/or chemical properties of the CMP agent.

Because the addition of supplementary materials can be dispensed with, the process of the invention can be carried out in a much easier and simpler and less costly manner than the prior art soft landing CMP processes.

Preferably, the CMP agent (A) provided in the first step of the process of invention comprises at least one component (a1)) which is capable of exhibiting, in the aqueous phase without the addition of supplementary materials, a change of at least one of its chemical and/or physical properties.

The change of the at least one chemical and/or physical property of the component (a1) can be triggered by various physical and/or chemical stimuli, except of course, the addition of supplementary materials.

Preferably, the at least one stimulus is selected from the group consisting of
(i) the change of the pH, the temperature or the concentration of the components (a2) hereinafter described in the aqueous phase,
(ii) the exposure to a magnetic field, an electric field and electromagnetic radiation,
(iii) the exposure to mechanical stress, and
(iv) the combination of at least two of the said stimuli;
and, more preferably, by
(i) the change of the pH, the temperature or the concentration of the components (a2) hereinafter described in the aqueous phase,
(iii) the exposure to mechanical stress, and
(iv) the combination of at least two of the said stimuli.

During the process of the invention, a large variety of physical and chemical properties of the component (a1) can be changed.

Preferably, the change of the at least one chemical and/or physical property of the component (a1) resides in its disintegration or in the change of its morphology, structure, solubility or functionality or in the combination of at least two of the said changes.

In the context of the present invention, "disintegration" means that the component (a1) is disintegrated by the mechanical stress encountered during the CMP process of the invention. The effect of the mechanical stress may be amplified by the other components of the CMP agent (A), in particular of the CMP agent of the invention.

More specifically, the at least one change of at least one chemical/or physical property of the component (a1) resides in the change of its hydrodynamic volume, the shape or the solvation state of the molecules of the component (a1), the absorption or desorption of the at least one component (a2) by the component (a1), the chemical reaction of the component (a1) with the at least one component (a2) hereinafter described, the complextation of the component (a2) hereinafter described by the component (a1) or in the combination of at least two of the said changes.

Most preferably, acids and bases are selected as the component (a2) for purposes of the absorption, desorption and chemical reaction. When metal ions are selected as the component (a2) for this purpose, the at least one change of the chemical and/or physical property of the component (a1) is effected by the complexation or chelatization of the metal ions (a2).

Particularly preferably, the component (a1) has a lower critical solution temperature LCST or an upper critical solution temperature UCST, with an LCST being preferred. Preferably, such an LCST or a UCST is observed in the aqueous phase. In the case of an LCST, the solubility of the component (a1) sharply decreases at this critical temperature. In the case of a UCST, the solubility sharply increases at the critical temperature. Both, of the LCST and the UCST can be determined by binary solution phase diagrams.

Therefore, more particularly preferably, the change of the at least one chemical and/or physical property of the component (a1) occurs at the LCST or the UCST, preferably the LCST.

Even more particularly preferably, the LCST or the UCST is in the range of from 25 to 90° C.

A large variety of different components (a1) may be selected for purposes of providing the CMP agent (A) in the first step of the process of the invention, as long as the said components (a1) exhibit the property profile described hereinbefore.

Thus, the components (a1) can be materials which are insoluble or soluble. The solubility causes the component (a1) to be homogeneously dissolved in the aqueous phase of the CMP agent (A), whereas the insolubility causes the component (a1) to be dispersed in particulate form in the aqueous phase of the CMP agent (A).

More preferably, the at least one, particularly one, component (a1) is selected from the group consisting of dispersed and dissolved oligomers and polymers.

In the context of the present invention, the terms "oligomer" or "oligomeric" mean that the material in question has a degree of polymerization of up to 10.

Moreover, in the context of the present invention, the terms "polymer" or "polymeric" mean that the material in question has a degree of polymerization of more than 10.

The oligomers or polymers (a1) can contain reactive functional groups which react with or complex at least one of the components (a2) hereinafter described. Examples of suitable reactive functional groups of this kind are primary and secondary amino groups and carboxylic acid groups.

Even more preferably, the oligomer or polymer (a1) is selected from the group consisting of cross-linked and non-cross-linked, linear, branched, hyperbranched, star shaped and dendrimeric poly(N-alkylacrylamide)s, poly(m- ethyl vinyl ether), poly(N-vinyl caprolactam), poly(N-ethyl oxazoline), elastine-like oligo- and polypeptides, poly(acrylic acid-co-acrylamide), copolymers of at least one monomer selected from the group of acrylic acid, methacrylic acid, maleic anhydride acrylamide, methacrylamide and vinyl aromatics, and at least one monomer selected from the group consisting of N,N-dialkylaminoalkyl acrylate and methacrylate; polyethers containing or consisting of at least one chain of copolymerized ethylene oxide moieties and at least one kind of alkylene oxide moieties having at least 3 carbon atoms to the moiety, the said chain having a distribution selected from the group of statistical, alternating and block form distributions; polyethylene glycol-polylactic-co-glycolic acid, polyethyleneimines, poly(amidoamine)s, poly(L-lysine) and modified chitosan.

These oligomers and polymers (a1) are well-known materials which are described, for example, in the article of H. Mori, H. Iwaya, A. Nagai and T. Endo, Controlled synthesis of thermoresponsive polymers derived from L-proline via RAFT polymerization, in Chemical Communication, 2005, 4872-4874; or in the article of D. Schmaljohann, Thermo- and pH-responsive polymers and drug delivery, Advanced Drug Delivery Reviews, volume 58 (2006), 1655-1670 or in the American patent applications US 2002/0198328 A1, US 2004/0209095 A1, US 2004/0217009 A1, US 2006/0141254 A1, US 2007/0029198 A1, US 2007/0289875 A1, US 2008/0249210 A1, US 2008/0050435 A1 or US 2009/0013609 A1, the American U.S. Pat. Nos. 5,057,560, 5,788,82 and 6,682,642 B2, the international patent applications WO 01/60926 A1, WO2004/029160 A1, WO 2004/0521946 A1, WO 2006/093242 A2 or WO 2007/012763 A1, in the European patent applications EP 0 583 814 A1, EP 1 197 587 B1 and EP 1 942 179 A1, or the German patent application DE 26 10 705; or they are sold under the trademarks Pluronic™, Tetronic™ and Basensol™ by BASF Corporation and BASF SE as evidenced by the company brochure of BASF Corporation "Pluronic™ & Tetronic™ Block Copolymer Surfactants, 1996" or the American patent US 2006/0213780 A1.

Most advantageously, the oligomer or polymer (a1) is selected such that the CMP agent of the invention is provided as CMP agent (A) in the first step of the process of the invention.

Therefore, for this purpose, the oligomer or polymer (a1) is selected from the group consisting of cross-linked and non-cross-linked, linear, branched, hyperbranched, star shaped and dendrimeric, in particular, cross-linked copolymers (a11) of at least one monomer (a111) selected from the group of acrylic acid, methacrylic acid, maleic anhydride, acrylamide and methacrylamide, in particular, methacrylamide, and vinyl aromatics, in particular styrene, and at least one monomer (a112) selected from the group consisting of N,N-dialkylaminoalkyl acrylate and methacrylate, in particular, methacrylate; and cross-linked and non-cross-linked, linear, branched, hyperbranched, star shaped and dendrimeric, in particular, non-cross-linked, branched, hyperbranched, star shaped and dendrimeric polyethers (a12) containing or consisting of at least one chain of copolymerized ethylene oxide moieties (a121) and at least one kind of alkylene oxide moieties (a122) having at least 3 carbon atoms to the moiety, in particular propylene oxide moieties, the said chain having a distribution selected from the group of statistical, alternating and block form distributions.

The alkyl groups of the N,N-dialkylamino group of the monomer (a12) is preferably selected from the group consisting of methyl, ethyl, propyl, isopropyl, n-, iso- and tert.-butyl, n-pentyl and n-hexyl groups, preferably methyl groups.

The alkyl group of the N,N-dialkylaminoalkyl group of the monomer (a12) is preferably selected from the group consisting of methyl, ethyl, propyl and n-butyl, preferably ethyl.

Therefore, the monomer (a112) most preferably used is N,N-dimethylaminoethyl methacrylate.

When the copolymers (a11) are to be cross-linked, bifunctional or higher functional monomers (a113) such as monomers having at least two acrylate or methacrylate groups such as ethyleneglycol diacrylate or at least two vinyl groups such as divinylbenzene are additionally employed.

The preparation of the copolymers (a11) offers no particularities but can be carried out preferably by the radical polymerization of the monomers (a111) and (a112) and, optionally, (a113) in mass, solution, emulsion or suspension.

The degree of oligomerization or polymerization of the non-cross-linked, linear polyethers (a12) consisting of moieties (a121) and (a122) having a random, alternating or block form distribution can vary very broadly and, therefore, can be adapted easily to special requirements and conditions. Preferably, the degree of oligomerization or polymerization is from 3 to 100,000, more preferably 5 to 80,000 and, most preferably, 10 to 60,000.

Also the molar ratio of moieties (a121) and (a122) can vary very broadly and, therefore, can be also adapted easily to special requirements and conditions. In particular, the balance between hydrophilic and hydrophobic properties of the polyethers (a12) can be easily adjusted. Preferably, the molar ratio (a121)/(a122) is from 1:10,000 to 10,000:1, more preferably 1:7500 to 7500:1 and, most preferably, 1:5000 to 5000:1.

Likewise, the degree of oligomerization or polymerization of the non-cross-linked, linear, branched, hyperbranched, star shaped and dendrimeric polyethers (a12) containing the moieties (a121) and (a122) having a random, alternating or block form distribution can vary very broadly and, therefore, can be adapted easily to special requirements and conditions. Preferably, the degree of oligomerization or polymerization is from 3 to 100,000, more preferably 5 to 80,000 and, most preferably, 10 to 60,000 per polymer chain.

Also here, the molar ratio of the moieties (a121) and (a122) can vary very broadly and, therefore, can be also adapted easily to special requirements and conditions. In particular, the balance between hydrophilic and hydrophobic properties of the polyethers (a12) here in question can be easily adjust it. Preferably, the molar ratio (a121)/(a122) is from 1:10,000 to 10,000:1, more preferably 1:7500 to 7500:1 and, most preferably, 1:5000 to 5000:1.

Additionally, the polyethers (a12) here in question can contain cabonate moieties (a123) derived from organic carbonates such as propylene carbonate.

Besides the oligomeric or polymeric chains consisting of the moieties (a121) and (a122), and, optionally (a123), the non-cross-linked, linear, branched, hyperbranched, star shaped and dendrimeric polyethers (a12) contain the residue of a monofunctional, bifunctional or polyfunctional starter molecule.

The starter molecules can be selected from large variety of different compounds as long as these compounds contain at least one reactive functional group which is capable of initiating the ring opening polymerization of alkylene oxides and, optionally, of organic carbonates. Preferably, the said at least one reactive functional group is selected from the group consisting of hydroxy and primary secondary amino groups. Therefore, the functionality of the starter molecules is preferably between 1 and 1000, more preferably 1 and 750 and, most preferably, 1 and 500.

Examples for suitable starter molecules containing at least one hydroxy group are aliphatic and cycloaliphatic alcohols such as methanol, ethanol, propanol, isopropanol, cyclohexanol, ethylene glycol, propylene glycol, butylene glycol, 1,2-, 1,3- and 1,4-dihydroxycyclohexane, hydrogenated bisphenol A and F, trimethylolpropane, pentaerythritol, dipentaerythritol, trispentaerythritol, glycerol, polyglycerol, mono-, di- and polysaccharides, sugar alcohols such as tetritols, pentitols and hexitols, and oligomers and polymers having on the average at least 5 hydroxy groups to the molecule such as polyvinyl alcohol or acrylate or methacrylate homopolymers and copolymers having pending hydroxy group containing side groups such as hydroxyethyl; and aromatic alcohols such as phenol, hydroquinone, resorcinol, pyrogallol and bisphenol A and F.

Examples for suitable starter molecules containing at least one primary or secondary amino group, more preferably at least one primary amino group, are aliphatic, cycloaliphatic and aromatic amines such methyl, ethyl, propyl, butyl, pentyl and hexyl amine and diamine, aniline, phenylene diamine, the amines described in the international patent application WO 2008/148766 A1, page 3, line 4 to page 4, line 11, and the polyethyleneimines prepared by the cationic ring opening polymerization of aziridine (cf. Römpp Online 2009, "polyethyleneimine"). Starter molecules which are particularly preferably used are selected from the group consisting of ethylene diamine and polyethylenimines, in particular polyethylenimines.

Therefore, the polyethers (a1) most particularly preferably used are alkoxylated polyethylenimines, especially those described in the international patent application WO 2006/108857 A1, claim 1 in conjunction with page 1, Summary of the Invention, pages 1 and 2, Detailed Description of the Invention, page 5, second paragraph to page 11, fourth paragraph, pages 17 and 18, Example 1, pages 18 and 19, Example 2, and pages 19 and 20, Example 3.

The amount of the component (a1) in the CMP agent (A) and in the CMP agent of the invention can vary broadly and, therefore, can be adjusted in the most advantageous manner to particular conditions and requirements. Preferably, the concentration of the component (a1)) ranges from 0.1 to 10% by weight, more preferably 0.25 to 7.5% by weight and, most preferably, 0.5 to 5% by weight, each weight percentage being based on the complete weight of the CMP agent (A) or of the CMP agent of the invention.

The CMP agent (A), in particular the CMP agent of the invention, provided in the first step of the process of the invention furthermore contains at least one additional component (a2) which is selected from the group of components being initially present in the aqueous phase components being generated in the aqueous phase during the process of the invention.

The additional components (a2) can be selected from a large variety of different materials customarily used in the art of CMP.

Preferably, the additional component (a2) is selected from the group consisting of organic, inorganic and hybrid organic-inorganic abrasive particles, oxidizing agents, passivating agents, complexing or chelating agents, frictive agents, stabilizing agents pH-adjusting agents, buffering agents, rheology agents, surfactants, metal cations and organic solvents.

Suitable organic abrasive particles (a2) and their effective amounts are known, for example, from the American patent application US 2008/0254628 A1, page 4, paragraph [0054] or from the international application WO 2005/014753 A1, wherein solid particles consisting of melamine and melamine derivatives such as acetoguanamine, benzoguanamine and dicyandiamide are disclosed.

Suitable inorganic abrasive particles (a2) and their effective amounts are known, for example, from the international patent application WO 2005/014753 A1, page 12, lines 1 to 8 or the American U.S. Pat. No. 6,068,787, column 6, line 41 to column 7, line 65.

Suitable hybrid organic-inorganic abrasive particles (a2) and their effective amounts are known, for example, from the American patent applications US 2008/0254628 A1, page 4, paragraph [0054] or US 2009/0013609 A1, page 3, paragraph [0047] to page 6, paragraph [0087].

Suitable oxidizing agents (a2) and their effective amounts are known, for example, from the European patent application EP 1 036 836 A1, page 8, paragraphs [0074] and [0075] or from the American patents U.S. Pat. No. 6,068,787, column 4, line 40 to column 7, line 45 or U.S. Pat. No. 7,300,601 B2, column 4, lines 18 to 34. Preferably, organic and inorganic peroxides, more preferably inorganic peroxides, are used. In particular, hydrogen peroxide is used.

Suitable passivating agents (a2) and their effective amounts are known, for example, from the American U.S. Pat. No. 7,300,601 B2, column 3, line 59 to column 4, line 9 or from the American patent application US 2008/0254628 A1, the paragraph [0058] bridging the pages 4 and 5.

Suitable complexing or chelating agents (a2), which are sometimes also designated as frictive agents (cf. the American patent application US 2008/0254628 A1, page 5, paragraph [0061]) or etching agents or etchants (cf. the American patent application US 2008/0254628 A1, page 4, paragrap [0054]), and their effective amounts are known, for example, from the American U.S. Pat. No. 7,300,601 B2, column 4, lines with 35 to 48. The amino acids, in particular glycine, and, moreover, dicyandiamide and triazines containing at least one, preferably two and more preferably three primary amino groups such as melamine and water-soluble guanamines, particularly melamine, formoguanamine, acetoguanamine and 2,4-diamino-6-ethyl-1,3,5-triazine, are most particularly preferably use.

Suitable stabilizing agents (a2) and their effective amounts are known, for example, from the American U.S. Pat. No. 6,068,787, column 8, lines 4 to 56.

Suitable pH-adjusting agents and buffering agents (a2) and their effective amounts are known, for example, from the European patent application EP 1 036 836 A1, page 8, paragraphs [0080], [0085] and [0086], the international patent application WO 2005/014753 A1, page 12, lines 19 to 24, the American patent application US 2008/0254628 A1, page 6, paragraph [0073] or the American U.S. Pat. No. 7,300,601 B2, column 5, lines 33 to 63. Most preferably, the pH of the CMP agent of the invention is adjusted to 3 to 7, particularly 4 to 6. Most preferably, nitric acid is used.

Suitable rheology agents (a2) and their effective amounts are known, for example, from the American patent application US 2008/0254628 A1, page 5, paragraph [0065] to page 6, paragraph [0069].

Suitable surfactants (a2) and their effective amounts are known, for example, from the international patent application WO 2005/014753 A1, page 8, line 23, to page 10, line 17 or from the American U.S. Pat. No. 7,300,601 B2, column 5, line 4 to column 6, line 8.

Suitable polyvalent metal ions (a2) and their effective amounts are known, for example, from the European patent application EP 1 036 836 A1, page 8, paragraph [0076] to page 9, paragraph [0078]. Most preferably, copper ions are used.

Suitable organic solvents (a2) and their effective amounts are known, for example, from the American U.S. Pat. No. 7,361,603 B2, column 7, lines 32 to 48 or the American patent application US 2008/0254628 A1, page 5, paragraph [0059].

The preparation of the CMP agents (A) and of the CMP agents of the invention in the first step of the process of the invention does not exhibit any particularities but can be carried out by dissolving or dispersing the above-described constituents (a1) and (a2) in an aqueous medium, in particular, de-ionized water. For this purpose, the customary and standard mixing processes and mixing apparatuses such as agitated vessels, in-line dissolvers, high shear impellers, ultrasonic mixers, homogenizer nozzles or counterflow mixers, can be used. Preferably, the CMP agents (A) and the CMP agents of the invention thus obtained can be filtered through filters of the appropriate mesh aperture, in order to remove coarse-grained particles such as the agglomerates or aggregates of the solid, finely dispersed abrasive particles (a2).

In the second step of the process of the invention, the surface of the bulk metal layer is contacted with the CMP agent (A), in particular, with the CMP agent of the invention.

In the third step of the process of the invention, the bulk metal layer is chemically and mechanically polished with the CMP agent (A), in particular, with the CMP agent of the invention until the bulk material layer is removed and the substrate surface is exposed.

During this process step,
  the initial SER remains the same or essentially the same whereas the initial MRR decreases,
  the initial SER decreases and the initial MRR remains the same or essentially the same or
  both the initial SER and the initial MRR decrease,
whereby a soft landing or touchdown is possible without the addition of supplementary materials including water.

In the context of the present invention, "essentially the same" means that the initial SER differs from the final SER for ±10%, preferably ±9%, more preferably ±8% and, most preferably, ±7%, the percentages being based on the initial SER. This equally applies to the MRR.

In the fourth step of the process of the invention, the chemical and mechanical polishing with the CMP agent (A), in particular, with the CMP agent of the invention is continued until all metal residues are removed from the exposed surface. Preferably, and the over-polishing is carried out for 5 to 120 seconds, more preferably 5 to 90 seconds and, most preferably, 5 to 60 seconds. As at this stage of the process of the invention, the CMP agent (A), in particular, the CMP agent of the invention has
  a SER which is the same or essentially the same as the initial SER and a MRR which is lower than the initial MRR,
  a SER which is lower than the initial SER and a MRR which is the same or essentially the same as the initial MRR or a SER and a MRR which are both lower than the initial SER and initial MRR at the start of the process,
meaning that
  the initial SER has remained the same or essentially the same, whereas the initial MRR has decreased;
  the initial SER has decreased and the initial MRR has remained the same or essentially the same
  the initial SER and MRR both have decreased.

Therefore, dishing, erosion and micro-scratching are significantly reduced, and the resulting polished and planarized surface is excellently suited for further processing in the course of the production of electrical and optical devices.

The polishing process of the invention exhibits no particularities but can be carried out with the processes and the equipment customarily used for the CMP in the fabrication of wafers with ICs.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the CMP agent (A), in particular, the CMP agent of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

By way of the process of the invention and the CMP agent of the invention wafers with ICs comprising copper damascene patterns can be obtained which have an excellent functionality.

EXAMPLES

Synthesis Example

Preparation of Solid Polymeric Particles (a1)

A 4 L reaction flask fitted with an anchor stirrer, including reflux condenser, 3 feeding lines at room temperature, was charged under nitrogen with 1500 g of deionized water and 4.5 g of hexadecyltrimethylammonium bromide. The contents of the flask were heated up to 70° C. At this temperature, 0.68 g V-50 (initiator from Wako) was charged to the reaction flask. Simultaneously, a monomer feed consisting 630 g of deionized water, 391.5 g styrene, 60 g of methacrylamide as a 15% solution in water, 4.5 g of divinylbenzene, and 2.48 g of hexadecyltrimethylammonium bromide was started and continually fed for 1.5 hours. At the same time, an initiator feed containing 170 g of deionized water and 2.3 g of V-50 was started and continually fed to the reaction flask for 2.5 hours. After 1.5 hours from the start of the first monomer feed, a second monomer feed consisting of 255 g of deionized water, 13.5 g of 2-dimethylaminoethyl methacrylate (DMAEMA), 0.9 g of hexadecyltrimethylammonium bromide and 31.5 g of styrene was started and continually fed to the reaction flask during 30 minutes. The obtained reaction mixture was post-polymerized for 2 hours at 70° C. and then cooled to room temperature. A dispersion of solid polymeric particles (A) with a solids content of 15% by weight was obtained. The mean particle size $d_{50}$ of the solid polymeric particles (a1) was 76 nm as measured by HPPS dynamic light scattering.

The physical and chemical properties of the solid polymeric particles (a1) were strongly influenced by the concentration of copper ions in the aqueous phase. Therefore, the solid polymer particles (a1) were excellently suited as the component (a1) in CMP agents (A) for copper CMP, during which process the copper ion concentration usually increases with increasing polishing time.

Examples 1 to 5

The Preparation of the CMP Agents (A1) to (A5) and their Soft Landing Behavior

For the preparation of the CMP agent (A1) of the Example 1, the polymer particles (a1) prepared in accordance with the Synthesis Example were used. The CMP agent (A1) contained 1% by weight of polymer particles (a1), 1% by weight hydrogen peroxide, 0.2% by weight of glycine and the remainder deionized water, all weight percentages being based on the complete weight of the CMP agent (A1). The pH of the CMP agent was adjusted to 5 with nitric acid or KOH.

For the preparation of the CMP agent (A2) of the Example 2, the reaction product (a1) of 1 mol ethylene diamine with 5.5 mols ethyleneoxide and 21 mols propylene oxide was used. The reaction product exhibited in deionized water at a concentration of 1% by weight an LCST of 43° C. The CMP agent (A2) contained 1% by weight of the said reaction product, 1% by weight of hydrogen peroxide, 0.2% by weight of glycine and the remainder deionized water, the weight percentages being based on the complete weight of the CMP agent (A1). The pH of the CMP agent (A1) was adjusted to 5 with nitric acid or KOH.

For the preparation of the CMP agent (A3) of the Example 3, the reaction product (a1) of 1 mol of polyethyleneimine (600 g/mol) with 27 mols ethyleneoxide and 18 mols propyleneoxide was used. The reaction product exhibited in deionized water at a concentration of 1% by weight an LCST of 40° C. The CMP agent (A3) contained 1% by weight of the said reaction product, 1% by weight of hydrogen peroxide, 0.2% by weight of glycine and the remainder deionized water, the weight percentages being based on the complete weight of the CMP agent (A1). The pH of the CMP agent was adjusted to 5 with nitric acid or KOH.

For the preparation of the CMP agent (A4) of the Example 4, the reaction product (a1) of 1 mol of polyethyleneimine (600 g/mol) with 24 mols ethyleneoxide and 16 mols propyleneoxide was used. The reaction product exhibited in deionized water at a concentration of 1% by weight an LCST of 42° C. The CMP agent (A4) contained 1% by weight of the said reaction product, 1% by weight of hydrogen peroxide, 0.2% by weight of glycine and the remainder deionized water, the weight percentages being based on the complete weight of the CMP agent (A1). The pH of the CMP agent was adjusted to 5 with nitric acid or KOH.

For the preparation of the CMP agent (A5) of the Example 5, the reaction product (a1) of 1 mol of polyethyleneimine (600 g/mol) with 24 mols ethyleneoxide and 14 mols propyleneoxide was used. The reaction product exhibited in deionized water at a concentration of 1% by weight an LCST of 48° C. The CMP agent (A5) contained 1% by weight of the said reaction product, 1% by weight of hydrogen peroxide, 0.2% by weight of glycine and the remainder deionized water, the weight percentages being based on the complete weight of the CMP agent (A1). The pH of the CMP agent was adjusted to 5 with nitric acid or KOH.

The soft landing behavior of the CMP agents (A1) to (A4) of the Examples 1 to 4 was evaluated by the determination of their static etch rates SER at 20° C. and 50° C. as follows:

The SERs were determined as follows.

Copper discs were initially conditioned, washed, dried and then weighed before each experiment. Copper disks were immersed for 10-20 seconds in 2% nitric acid and then rinsed with deionized $H_2O$ and subsequently dried with compressed air. Then Cu disks were directly immersed in the stirred CMP agents (A1) to (A4) in a first series at 20° C. for 3 min and in a second series at 50° C. for 10 minutes each. After the etching, the copper discs were cleaned with deionized water followed by an isopropyl alcohol rinse. Thereafter, the copper discs were dried with a steady stream of pressurized air, and the SER was calculated on the net weight-loss and the surface area of the disc using the following calculation:

$$SER = \text{Weight-loss}/[\text{Density} \times (\text{Circumferential Area} + 2 \times \text{Area of Cross-section}) \times \text{Time}],$$

wherein
Weight-loss=loss of weight in copper disc after dissolution;
Density=density of copper;
Area of Cross-section=cross-section area of the disc;
Circumferential Area=circumferential area of the disc; and
Time=dissolution time.

The results of the measurements are compiled in the Table 1 for the Examples 1 to 4.

TABLE 1

| SER of the CMP Agents (A1) to (A4) of the Examples 1 to 4 |||
| Example | SER@20° C./ nm/min | SER@50° C./ nm/min |
| --- | --- | --- |
| 1 | 50 | 30 |
| 2 | 48.8 | 37.5 |
| 3 | 43.9 | 41.8 |
| 4 | 40.6 | 42.9 |

All the CMP agents (A1) to (A4) showed a pronounced soft landing CMP. Moreover, the planarization efficiency was high. This equally applied to the CMP agent (A5). Last but not least, all the polished copper discs of the Examples 1 to 5 were shiny without stains.

Example 6 and Comparative Example 1

The Preparation of the CMP Agents (A6) (Example 6) and (C1) (Comparative Example 1) and Their Soft Landing and Over-Polishing Behavior For the preparation of the CMP agent (A6) of the Example 6, the reaction product of 1 mol ethylene diamine with 5.5 mols ethyleneoxide and 21 mols propylene oxide was used. The reaction product exhibited in deionized water at a concentration of 1% by weight an LCST of 43° C.

The CMP agent (A6) contained 1% by weight of the said reaction product, 1% by weight of solid melamine particles, 3% by weight of hydrogen peroxide, 0.6% by weight of glycine, 0.05% by weight of the surfactant (Triton™ X-100 of Dow), 6 mM benzoimidazole, 300 ppm chloride ions and the remainder deionized water, the weight percentages being based on the complete weight of the CMP agent (A6). The pH of the CMP agent was adjusted to 5 with nitric acid or KOH.

The CMP agent (C1) of the Comparative Example 1 contained 1% by weight of solid melamine particles, 3% by weight of hydrogen peroxide, 0.6% by weight of glycine, 0.05% by weight of the surfactant (Triton™ X-100 of Dow), 6 mM benzoimidazole, 300 ppm chloride ions and the remainder deionized water, the weight percentages being based on the complete weight of the CMP agent (C1). The pH of the CMP agent was adjusted to 5 with nitric acid or KOH.

Copper discs were conditioned as described in the Examples 1 to 5. Thereafter, the conditioned copper discs were polished under the following conditions:
Polisher: Strasbaugh 6EC
Pad: IC1000
Table speed: 115 rpm
Carrier speed: 112 rpm
Downforce: 17.24 kPa (2.5 psi)
Ring force: 37.93 kPa (5.5 psi)
Feed rate: 200 ml/min The pad was conditioned with diamond grit conditioner to remove the products of the chemical reactions and to make the pad ready for the next run. After polishing, the discs were cleaned with a deionized water rinse followed by an isopropyl alcohol rinse. Thereafter, the discs were dried with a steady stream of pressurized air, and the MRR was calculated based on the net weight-loss in the polished surface area according to the calculation:

$$MRR = Weight\text{-}loss / (Density \times Area\ of\ Cross\text{-}section \times Time);$$

wherein
Weight-loss=loss of weight in copper disc after polish;
Density=density of copper;
Area of Cross-section=cross-section area of the disc; and
Time=polishing time.

6 series of copper wafers were polished for 20, 40, 60, 80, 100 and 120 seconds for the Example 6 and the Comparative Experiment C1 and the MRR with polishing time were determined. The results of the tests are compiled in the Table 2.

TABLE 2

The Dependence of the MRR on Polishing Time

| Time/seconds | Example 6 MRR/nm/min | Comparative Experiment C1 MRR/nm/min |
|---|---|---|
| 20 | 580 | 510 |
| 40 | 500 | 500 |
| 60 | 500 | 500 |
| 80 | 480 | 490 |
| 100 | 470 | 490 |
| 120 | 470 | 490 |

The results of the tests demonstrated that, contrary to the CMP agent (C1), the CMP agent (A6) exhibited a significant decrease of the MRR with increasing polishing time and corresponding increase in polishing temperature. Therefore, the CMP agent (A6) was excellently suited for soft landing CMP.

The over-polishing behavior was tested with Sematech 854 copper patterned wafers which were polished with the equipment and under the conditions set out above. After the polishing, the thickness of the polished copper blanket wafers was measured using a Prometrix RS 35, a four-point probe sheet resistant tool. The step heights were measured using an Ambios XP2 profilometer.

In the middle of the patterned wafer (die 3) a dishing height of 134.3 nm was observed after an over-polishing time<20 seconds with the CMP agent (C1), whereas a dishing height of only 48.7 nm was observed after an over-polishing time>20 seconds and <40 seconds with the CMP agent (A6).

Accordingly, in the center of the patterned wafer (die 5) a dishing height of 134 nm was observed after an over-polishing time<20 seconds with the CMP agent (C1), whereas a dishing height of only 29.5 nm was observed after an over-polishing time>20 seconds and <40 seconds with the CMP agent (A6).

This demonstrated that the CMP agent (A6) had also an excellent over-polishing behavior.

The invention claimed is:

1. A process, comprising:
(1) contacting a surface of a bulk material layer of a substrate with an aqueous chemical mechanical polishing agent exhibiting at the end of a chemical mechanical polishing, without addition of any supplementary material:
the same or essentially the same static etch rate SER as at a start of the chemical mechanical polishing, and a lower material removal rate MRR than at the start of the chemical mechanical polishing;
a lower static etch rate SER than at the start of the chemical mechanical polishing, and the same or essentially the same material removal rate MRR as at the start of the chemical mechanical polishing; or
a lower static etch rate SER and a lower material removal rate MRR than at the start of the chemical mechanical polishing;
(2) chemically and mechanically polishing the bulk material layer with the aqueous chemical mechanical polishing agent while:
an initial SER of the chemical polishing agent remains the same or essentially the same, and an initial MRR of the chemical polishing agent decreases;
the initial SER decreases, and the initial MRR remains the same or essentially the same; or
the initial SER and the initial MRR both decrease,
until a bulk material layer is removed and a substrate surface is exposed; and
(3) continuing chemical mechanical polishing with the chemical mechanical polishing agent until all material residuals are removed from the exposed surface
wherein the aqueous chemical mechanical polishing agent comprises
(a1) 0.1 to 10% by weight of a polyether comprising a chain of at least one copolymerized ethylene oxide and at least one copolymerized alkylene oxide having at least 3 carbon atoms or an alkoxylated polyethyleneimine, said chain having a statistical, alternating, or block distribution, wherein (a1) is a component capable of exhibiting in an aqueous phase, without addition of any supplementary material, a change of at least one chemical property, physical property, or both and which has a lower critical solution temperature LCST or an upper critical solution temperature UCST wherein the change of the at least one chemical and/or physical property of component (a1) occurs at the LCST or the UCST and wherein the LCST or the UCST is in the range of from 30 to 90° C., and comprising a residue of at least one starter molecule selected from the group consisting of ethylene diamine and a polyethyleneimine; and (a2) at least one additional component selected from the group consisting of a component initially present in the aqueous phase and a component generated in the aqueous phase during the process.

2. The process of claim 1, wherein the change of the at least one chemical and/or physical property of component (a1) corresponds to a change of the component (a1) morphology, structure, solubility or functionality, or a combination of at least two of the said changes.

3. The process of claim 2, wherein the change of the at least one chemical and/or physical property of component (a1) corresponds to a change of hydrodynamic volume, shape or solvation state of molecules of the component (a1), absorption or desorption of the at least one additional component (a2) by the component (a1), chemical reaction of the component (a1) with the at least one additional component (a2), complexation of the at least one additional component (a2) by the component (a1), or a combination of at least two of the said changes.

4. The process of claim 1, wherein the additional component (a2) is at least one selected from the group consisting of an acid, a base and a metal ion.

5. The process of claim 4, wherein the change of the at least one chemical and/or physical property of component (a1) is effected by complexation of the metal ion (a2) by the component (a1).

6. The process of claim 1, wherein the component (a1) is selected from the group consisting of a material soluble in an aqueous phase of the chemical mechanical polishing agent and a material insoluble in the aqueous phase of the chemical mechanical polishing agent.

7. The process of claim 6, wherein the component (a1) is selected from the group consisting of a dispersed oligomer, a dissolved oligomer, a dispersed polymer, and a dissolved polymer.

8. The process of claim 1, wherein the component (a1) comprises a reactive functional group which reacts with or complexes at least one of the additional component (a2).

9. The process of claim 1, wherein the bulk material of the bulk material layer is selected from the group consisting of a dielectric material and an electrically conductive material.

10. The process of claim 9, wherein:
the bulk material is the electrically conductive material; and
the electrically conductive material is a metal having a standard reduction potential $E^0 > -0.1$ V for the half-reaction $M \leftrightarrow M^{n+} + n\ e^-$, such that n=integer of from 1 to 4 and $e^-$ is an electron.

11. The process of claim 10, wherein the metal is copper.

12. The process of claim 1, wherein the substrate comprises a metal pattern embedded in its surface.

13. The process of claim 1, wherein the aqueous chemical mechanical polishing agent comprises:
(a1) a polyether comprising a chain of at least one copolymerized ethylene oxide and at least one copolymerized alkylene oxide having at least 3 carbon atoms, said chain having a statistical, alternating, or block distribution; and (a2) an additional component,
with the exception of a polymer having a mean particle size $d_{50}$ of 76 nm as measured by HPPS dynamic light scattering and prepared by:
Charging under nitrogen 1500 g of deionized water and 4.5 g of hexadecyltrimethylammonium bromide to a reaction flask,
heating contents of the reaction flask up to 70° C.,
charging, at this temperature, 0.68 g 2,2'-azo-(2-amidinopropane) dihydrochloride to the reaction flask,
simultaneously starting a monomer feed consisting of 630 g of deionized water, 391.5 g styrene, 60 g of methacrylamide as a 15% solution in water, 4.5 g of divinylbenzene, and 2.48 g of hexadecyltrimethylammonium bromide and continually feeding it for 1.5 hours,
starting, at the same time, an initiator feed containing 170 g of deionized water and 2.3 g of 2,2'-azo-(2-amidinopropane) dihydrochloride and continually feeding it to the reaction flask for 2.5 hours,
starting after 1.5 hours from the start of the first monomer feed, a second monomer feed consisting of 255 g of deionized water, 13.5 g of 2-dimethylaminoethyl methacrylate, 0.9 g of hexadecyltrimethylammonium bromide and 31.5 g of styrene and continually feeding it to the reaction flask during 30 minutes,
post-polymerizing the obtained reaction mixture for 2 hours at 70° C. and then cooling it down to room temperature, and
thereby obtaining a dispersion of solid polymeric particles with a solids content of 15% by weight.

14. An aqueous chemical mechanical polishing agent (A), comprising:
(a1) a polyether comprising a chain of at least one copolymerized ethylene oxide and at least one copolymerized alkylene oxide having at least 3 carbon atoms, said chain having a statistical, alternating, or block distribution comprising a residue of at least one starter molecule selected from the group consisting of ethylene diamine and a polyethyleneimine; and
(a2) an additional component;
with the exception of a polymer having a mean particle size $d_{50}$ of 76 run as measured by HPPS dynamic light scattering and prepared by:
Charging under nitrogen 1500 g of deionized water and 4.5 g of hexadecyltrimethylammonium bromide to a reaction flask,
heating the contents of the flask up to 70° C.,
charging, at this temperature, 0.68 g 2,2'-azo-(2-amidinopropane) dihydrochloride to the reaction flask,
simultaneously starting a monomer feed consisting of 630 g of deionized water, 391.5 g styrene, 60 g of methacrylamide as a 15% solution in water, 4.5 g of divinylbenzene, and 2.48 g of hexadecyltrimethylammonium bromide and continually feeding it for 1.5 hours,
starting, at the same time, an initiator feed containing 170 g of deionized water and 2.3 g of 2,2'-azo-(2-amidinopropane) dihydrochloride and continually feeding it to the reaction flask for 2.5 hours,
starting after 1.5 hours from the start of the first monomer feed, a second monomer feed consisting of 255 g of deionized water, 13.5 g of 2-dimethylaminoethyl methacrylate, 0.9 g of hexadecyltrimethylammonium bromide and 31.5 g of styrene and continually feeding it to the reaction flask during 30 minutes, post-polymerizing the obtained reaction mixture for 2 hours at 70° C. and then cooling it down to room temperature, thereby obtaining a dispersion of solid polymeric particles with a solids content of 15% by weight.

15. The aqueous chemical mechanical polishing agent of claim 14, wherein the additional component (a2) is at least one selected from the group consisting of an organic abrasion particle, an inorganic abrasion particle, a hybrid organic-inorganic abrasive particle, an oxidizing agent, a passivating agent, a complexing agent, a chelating agent, a frictive agent, a stabilizing agent, a pH-adjusting agent, a buffering agent, a rheology agent, a surfactant, a metal cation and an organic solvent.

16. An electrical or optical device obtained by the process of claim 1.

* * * * *

UNITED STATES PATENT AND TRADEMARK OFFICE
CERTIFICATE OF CORRECTION

PATENT NO. : 10,392,531 B2
APPLICATION NO. : 13/510830
DATED : August 27, 2019
INVENTOR(S) : Vijay Immanuel Raman et al.

It is certified that error appears in the above-identified patent and that said Letters Patent is hereby corrected as shown below:

In the Specification

In Column 8, Lines 54-55, after "paragraph" insert -- [0024] --.

In Column 9, Line 38, "(a1))" should read -- (a1) --, therefor.

In Column 13, Line 46, "(a1))" should read -- (a1) --, therefor.

In the Claims

In Column 22, Line 46, Claim 14, "run" should read -- nm --, therefor.

Signed and Sealed this
Fourteenth Day of January, 2020

Andrei Iancu
*Director of the United States Patent and Trademark Office*